United States Patent
Edwards et al.

(10) Patent No.: US 7,782,702 B1
(45) Date of Patent: Aug. 24, 2010

(54) APPARATUS AND METHOD FOR MEMORY CELL POWER-UP SEQUENCE

(75) Inventors: Eric E. Edwards, Albuquerque, NM (US); Charles D. Laverty, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 146 days.

(21) Appl. No.: 12/245,144

(22) Filed: Oct. 3, 2008

(51) Int. Cl.
*G11C 5/14* (2006.01)

(52) U.S. Cl. .................... 365/226; 365/228; 365/229; 365/206

(58) Field of Classification Search ............... 365/226, 365/228, 229, 206
See application file for complete search history.

(56) References Cited

U.S. PATENT DOCUMENTS

| | | | | |
|---|---|---|---|---|
| 5,912,428 A | * | 6/1999 | Patti .......................... 102/215 |
| 5,963,496 A | * | 10/1999 | Pathak et al. ........... 365/189.15 |
| 6,104,635 A | * | 8/2000 | Ogane .................... 365/185.08 |
| 6,577,553 B2 | * | 6/2003 | Makabe et al. ......... 365/230.06 |
| 6,922,074 B2 | * | 7/2005 | Coughlin et al. ............... 326/30 |
| 7,373,533 B2 | * | 5/2008 | Sahu et al. ................... 713/300 |
| 7,688,668 B2 | * | 3/2010 | Hold .......................... 365/226 |

* cited by examiner

*Primary Examiner*—Viet Q Nguyen
(74) *Attorney, Agent, or Firm*—Michael T. Wallace; Thomas George

(57) ABSTRACT

A method and apparatus is provided to enhance the power-up sequence for integrated circuits (ICs) that contain memory cells having single-ended data inputs with no local reset function. During a power-up sequence, the logic levels that are applied to the data, address, and power inputs of the memory cell are restricted to particular magnitudes by a power-on reset (POR) state machine. First, the data input of the memory cell is held to a logic low value while an address signal of the memory cell is allowed to be asserted to a logic high value in conjunction with activating a power supply that provides operational power to the IC. Next, the address input to the memory cell ramps up to full logic high value, while the regulated power supply to the memory cell array is held low. The regulated power supply then ramps up to an operational level to bias the memory cell into a known logic state.

12 Claims, 6 Drawing Sheets

APPARATUS AND METHOD FOR MEMORY CELL POWER-UP SEQUENCE

FIELD OF THE INVENTION

The present invention generally relates to integrated circuits, and more particularly to enhanced power-up sequences for the memory cells contained within the integrated circuits.

BACKGROUND OF THE INVENTION

PLDs are a well-known type of integrated circuit (IC) that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, digital clock managers (DCMs), Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of IC is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these ICs, the functionality of the device is controlled by configuration data bits provided to the device for that purpose. The configuration data bits can be stored in volatile memory (e.g., static memory cells, as in FPGAs and some CPLDs), in non-volatile memory (e.g., FLASH memory, as in some CPLDs), or in any other type of memory cell.

Advancements in memory cell design have reduced the number of input/output (I/O) interfaces that are required to program, i.e., flip, the advanced memory cell. In particular, differential write memory cells have yielded to single-ended memory cells so as to significantly reduce the number of differential drivers required to configure the advanced memory cells. In addition, local reset circuitry has been removed from the advanced memory cells so as to further reduce I/O interface hardware and complexity within the memory cell.

Such I/O reductions, however, significantly increase the difficulties encountered when attempting to place the memory cell into a known logic state while the IC executes a power-up sequence. Providing additional logic pull-downs within the IC's repeater cells is insufficient, since the current magnitude drawn by a particular memory cell array may preclude a guaranteed logic state of the memory cell during a power-up sequence of the IC.

Efforts continue, therefore, to provide power-up circuitry and power-up sequences that allow the enhanced memory cells to be correctly biased to known logic states during initialization/power-up of the IC.

SUMMARY OF THE INVENTION

To overcome limitations in the prior art, and to overcome other limitations that will become apparent upon reading and understanding the present specification, various embodiments of the present invention disclose an apparatus and method for an enhanced power-up sequence for advanced memory cells contained within an integrated circuit to pre-bias each memory cell into a known logic state.

In accordance with one embodiment of the invention, a method of biasing the logic state of a memory cell during a power-up sequence comprises activating a first power supply to assert a first power supply signal, deasserting a data input signal to the memory cell, clamping a second power supply signal to be substantially equal to a zero volt magnitude, and asserting an address signal to the memory cell in response to the asserted first power supply signal while the second power supply signal is substantially equal to a zero volt magnitude. The method further comprises initializing the second power supply, where the second power supply is adapted to provide operational power to the memory cell and maintaining the data input signal at the deasserted logic state during the initialization of the second power supply to bias the logic state of the memory cell during the power-up sequence.

In accordance with another embodiment of the invention, a memory cell array controller comprises a plurality of memory cells and a power-on reset state machine that is adapted to control a power-on reset sequence of each memory cell. The memory cell array controller further comprises a first power supply that is coupled to a power supply terminal of each memory cell and is adapted to provide operational power to each memory cell in response to the assertion of a first power-on reset signal provided by the power-on reset state machine. The memory cell array controller further comprises an address driver that is coupled to each memory cell, the address driver being adapted to assert a first address line of each memory cell prior to the assertion of the first power-on reset signal in response to activation of a second power supply. The memory cell array controller further comprises a configuration controller that is coupled to a data input terminal of each memory cell, the configuration controller being adapted to maintain a logic value at each data input terminal of each memory cell during the power-on reset sequence.

In accordance with another embodiment of the invention, a method of performing a power-on reset sequence within an integrated circuit comprises activating a first power supply to assert a first power supply signal within the integrated circuit, deasserting data input signals to a plurality of memory cells contained within the integrated circuit, clamping a second power supply signal within the integrated circuit to be substantially equal to a zero volt magnitude and asserting address signals to the plurality of memory cells in response to the asserted first power supply signal while the second power supply signal is substantially equal to a zero volt magnitude.

The method further comprises initializing the second power supply, the second power supply being adapted to provide operational power to the plurality of memory cells and maintaining the data input signals at the deasserted logic states during the initialization of the second power supply to bias the logic states of the plurality of memory cells to predetermined logic levels.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
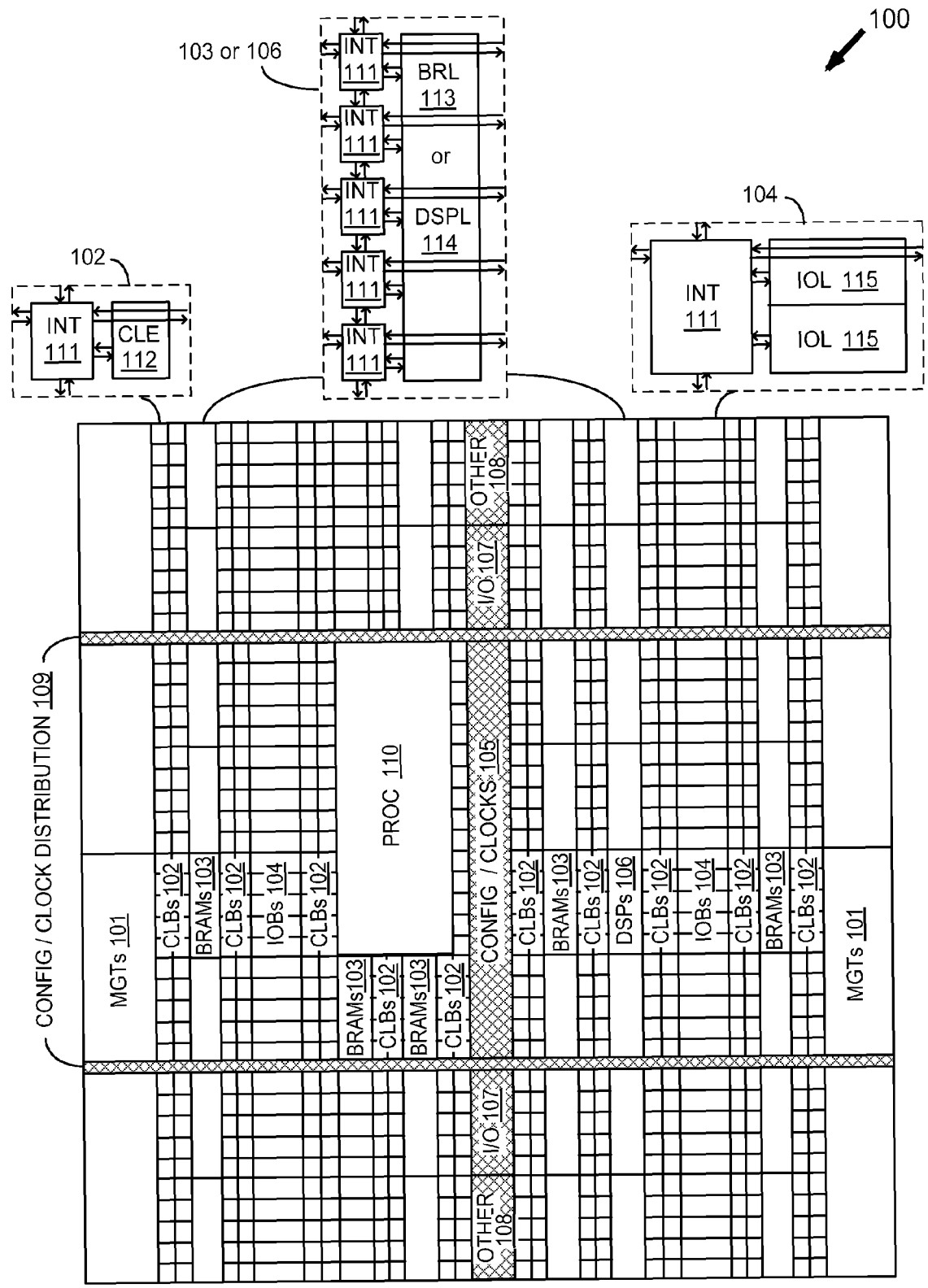
FIG. 1 illustrates an exemplary Field Programmable Gate Array (FPGA) architecture.

Generally, various embodiments of the present invention are applied to the field of integrated circuits (ICs) of which programmable logic devices (PLDs) are a subset. In particular, a method and apparatus is provided to enhance the power-up sequence for ICs that contain memory cells having single-ended data inputs and that do not contain a local reset function.

Various embodiments of the present invention are illustrated by reference to Field-Programmable Gate Arrays (FPGAs) which are a type of PLD. However, inventive concepts described herein may be applied to many types of integrated circuits in which memory cells are used.

The memory cell in accordance with one embodiment of the present invention contains a pair of cross-coupled inverters that implement the latch function of the memory cell. Each latch input is gated using n-type metal oxide semiconductor (NMOS) pass gates that are rendered conductive in response to a pair of address signals that are received by the memory cell. A first address signal, for example, may be applied to the control node, e.g., gate terminal, of a first pass gate to render the first pass gate conductive, thereby allowing a data signal to be written into the first latch component of the memory cell. Similarly, a second address signal may be applied to the control node, e.g., gate terminal, of a second pass gate to render the second pass gate conductive, thereby allowing the data signal to be written into the second latch component of the memory cell.

In operation, the memory cell is programmed, i.e., flipped, by first asserting the first address signal and deasserting the second address signal to render the first pass gate conductive. Next, a logic data value is written to the first latch component of the memory cell. The second address signal is then asserted and the first address signal deasserted to render the second pass gate conductive. The complement of the logic data value written to the first latch component is then written to the second latch component of the memory cell.

During a power-up sequence, the logic levels that are applied to the data, address, and power inputs of the memory cell are restricted to particular magnitudes. First, the first address signal of the memory cell is allowed to be asserted to a logic high value, e.g., a voltage magnitude that is substantially equal to a power supply signal magnitude, e.g., $V_{DD}$. Next, the data input to the memory cell is deasserted to a logic low value. The voltage magnitude that is provided to the power terminal, e.g., $V_{GG}$, of the memory cell is to be substantially equal to ground potential. Next, the voltage magnitude that is provided to the power terminal, e.g., $V_{GG}$, of the memory cell is allowed to ramp up to an operational level during the power-up sequence. As such, a known logic level is latched by the memory cell after the power-up sequence is completed.

It is noted that the power signal that is applied to the memory cell is generated by a regulated power source that is different than the power source utilized by the address signal generation circuitry. In such an instance, the logic value of the first and/or second address signals may be asserted in a reliable fashion before the regulated power signal magnitude that is applied to the memory cell achieves an operational level.

As noted above, advanced FPGAs can include several different types of programmable logic blocks in the array. For example, FIG. 1 illustrates an FPGA architecture 100 that includes a large number of different programmable tiles including multigigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration memory cells, clock, and other control logic. Horizontal areas 109 extending from this column are used to distribute the clocks and configuration signals across the breadth of the FPGA. For example, the various phase variants of clock signals generated by the DCMs of the FPGA may be distributed to various user logic regions that may be configured across the breadth of the FPGA. Additionally, repeater cells (not shown) are utilized within the shaded areas of FIG. 1 to provide driver functionality to one or more arrays of configuration memory cells. For example, an array of configuration memory cells may include a number, e.g., 60, of configuration memory cells that are required to distribute the necessary configuration logic to a pair of CLBs 102.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs are typically included wherever the CLBs appear, to facilitate the efficient implementation of user logic, but the number of adjacent CLB columns varies with the overall size of the FPGA.

Figure 2:
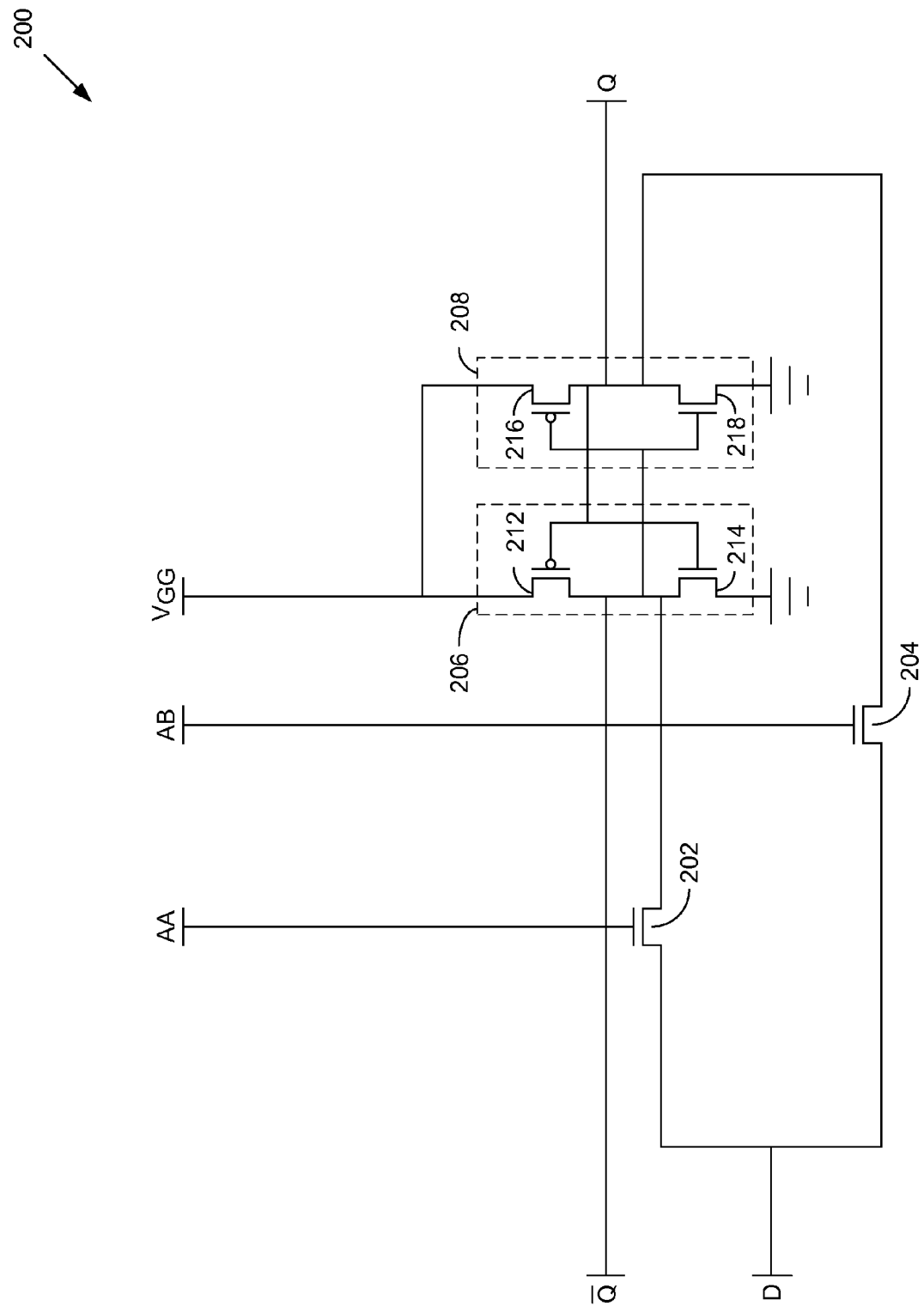
FIG. 2 illustrates a schematic diagram of a memory cell in accordance with an embodiment of the present invention.

Turning to FIG. 2, an exemplary schematic diagram of memory cell 200 in accordance with one embodiment of the present invention is illustrated. Latch components 206-208 are comprised of transistor pairs 212,214 and 216,218, respectively, whereby each transistor pair is configured as an inverter as illustrated. Latch component 208 provides output, Q, from memory cell 200 and latch component 206 provides output, Q-complement, from memory cell 200. Additionally, the output of latch component 206 is connected to the input of latch component 208, while the output of latch component 208 is connected to the input of latch component 206. Input data terminal, D, is connected to the input of latch components 206-208 via pass gates 204 and 202, respectively.

In operation, memory cell 200 is programmed, i.e., flipped, by first asserting a logic data value at terminal, D, while address signals, AA and AB, are de-asserted. Next, the address signal at terminal, e.g., AA, is asserted to render pass gate 202 conductive while the address signal at terminal, e.g., AB, is still de-asserted to render pass gate 204 non-conductive. Next, a logic data value is written to latch component 208 via pass gate 202 to set the logic level at terminal, Q, of memory cell 200. The complement logic data value is then applied to terminal, D. The address signal at terminal, e.g., AB, is then asserted to render pass gate 204 conductive and the address signal at terminal, e.g., AA, is deasserted to render pass gate 202 non-conductive. The complement of the logic data value written to latch component 208 is then written to latch component 206 via pass gate 204 to set the complement logic level at terminal, Q-complement, of memory cell 200.

Figure 3:
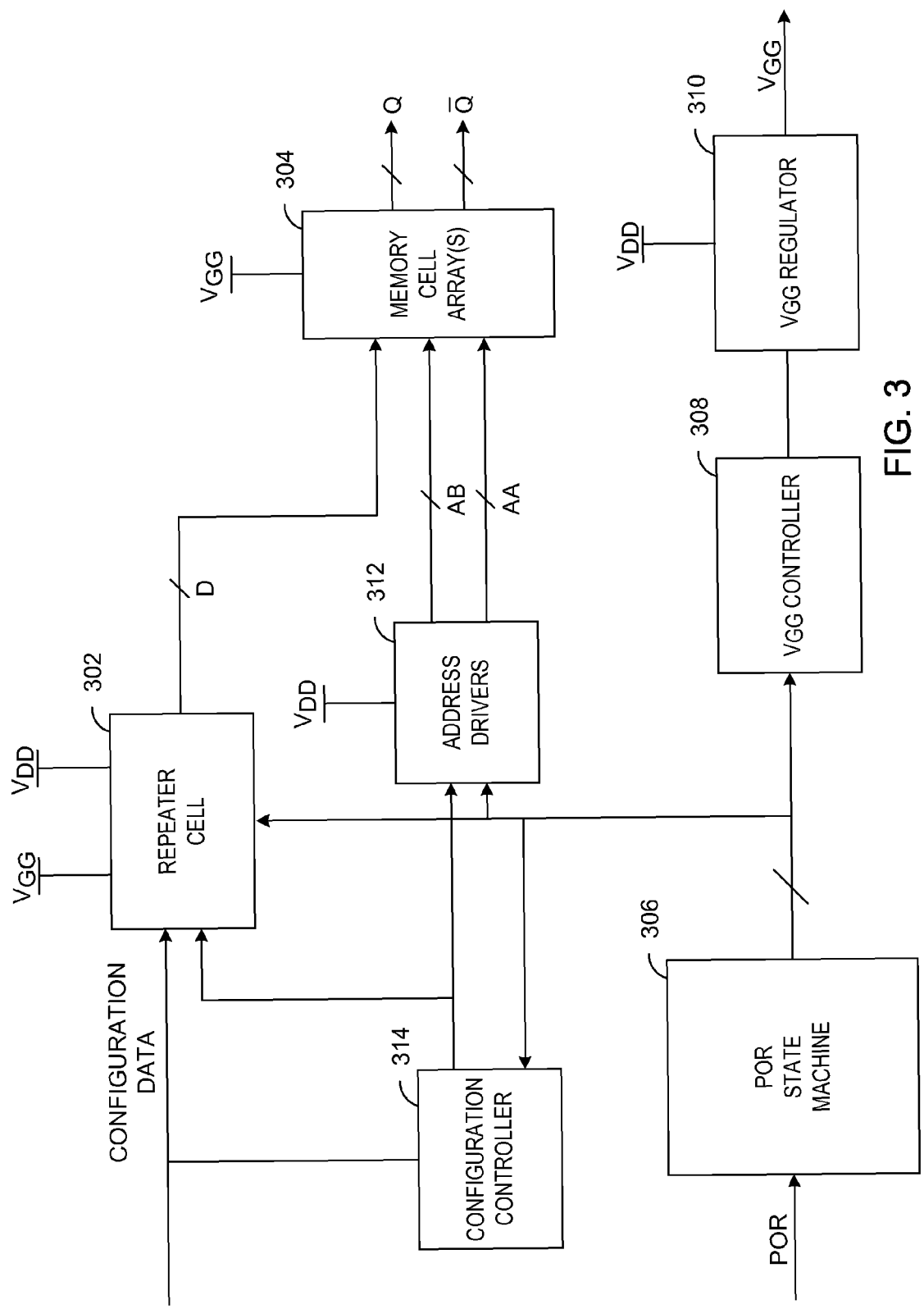
FIG. 3 illustrates a block diagram of a memory cell array controller in accordance with an embodiment of the present invention.

During a power-up sequence, the logic levels that are applied to the data, address, and power supply terminals of memory cell 200 are restricted to a particular sequence of logic levels in accordance with the execution state of a power-on reset (POR) state machine. Turning to FIG. 3, for example, an exemplary block diagram of a memory cell array controller is illustrated, whereby POR state machine 306 is in communication with repeater cell 302, configuration controller 314, address drivers 312, $V_{GG}$ controller 308, and $V_{GG}$ regulator 310 via $V_{GG}$ controller 308. Repeater cell 302 is connected to one or more memory cell arrays 304, which contain a plurality of memory cells 200, as discussed above in relation to FIG. 2.

POR state machine 306 executes the power-on reset sequence that is discussed in more detail below in relation to FIG. 4. Once the power-on reset sequence is completed, various repeater cells 302 distribute configuration data to the corresponding memory cell arrays contained within the PLD, so as to control the programmable interconnect and the programmable logic to define how the programmable elements are configured within the PLD.

Figure 4:
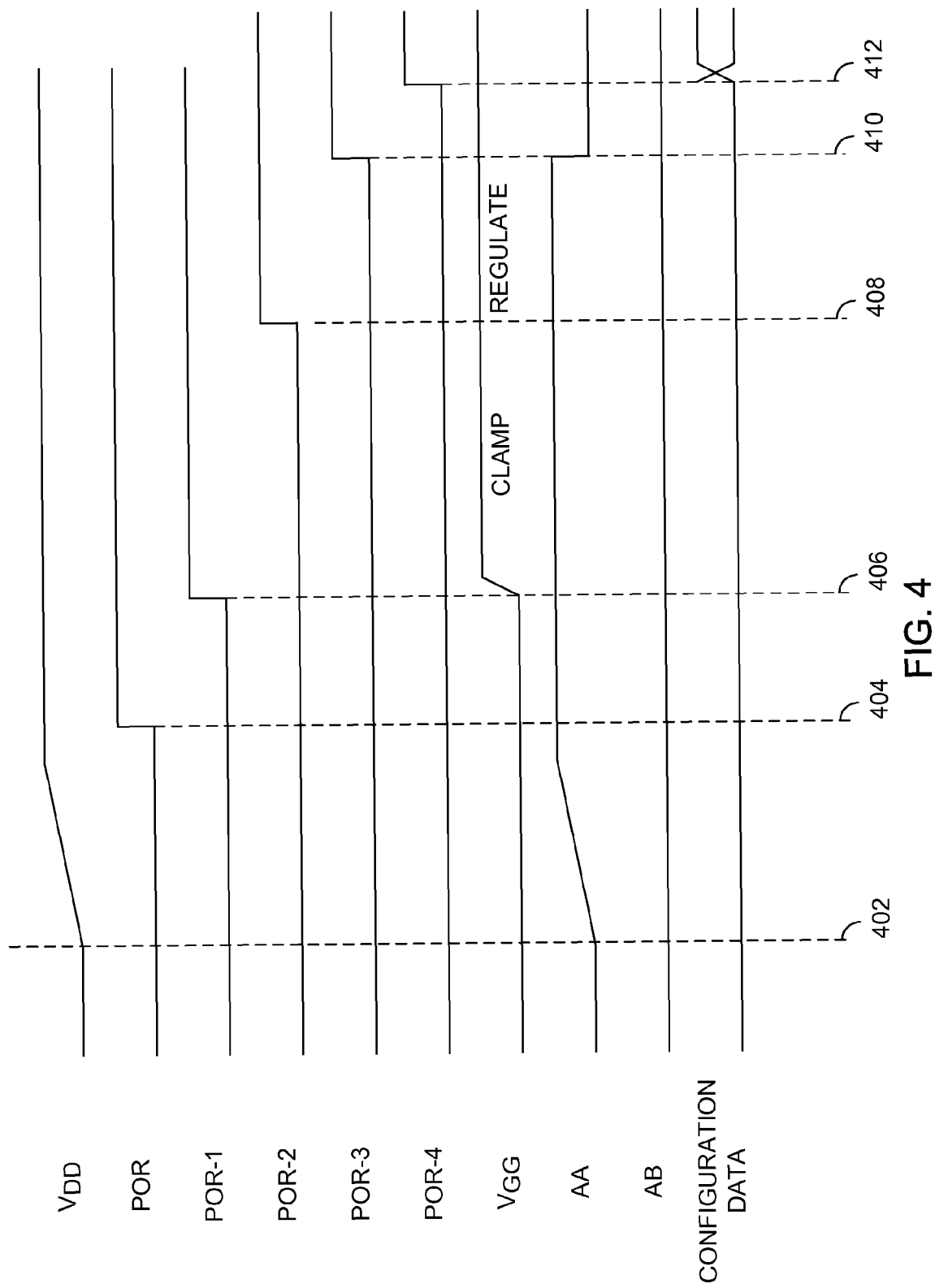
FIG. 4 illustrates a power-up sequence executed by the memory cell array controller of FIG. 3 in accordance with an embodiment of the present invention.

Turning to FIG. 4, a timing diagram of the memory cell power-up sequence, as executed by POR state machine 306 of FIG. 3, in accordance with one embodiment of the present invention is exemplified. At time 402, the power supply voltage magnitude that is applied to terminal, $V_{DD}$, is allowed to begin ramping to its operational magnitude. Since address line driver 312 receives its operational power from terminal, $V_{DD}$, the voltage magnitude that is present on address line, e.g., AA, simultaneously ramps to a logic high value. The voltage magnitude that is present on address line, e.g., AB, is held to a logic low value, so as to prevent programming latch component 206 with conflicting data as compared to latch component 208. Turning back to FIG. 2, it is seen that pass gate 202 within memory cell 200 of memory cell array(s) 304 is rendered conductive once the voltage magnitude at address line, AA, exceeds the threshold potential of pass gate 202.

Since the voltage magnitude of the configuration data signal, CONFIGURATION DATA, applied to terminal, D, of each memory cell of memory cell array(s) 304 is held to a logic low value by configuration controller 314, a logic low value is allowed to pre-bias the input of latch component 208 of each memory cell. At time 404, signal POR is asserted to a logic high level, which resets POR state machine 306. In response, the voltage magnitude applied to terminal, $V_{GG}$, by $V_{GG}$ regulator 310 either remains pulled down to a logic low value as illustrated, or is allowed to float to an indeterminate logic level at time 404.

At time 406, POR state machine 306 instructs $V_{GG}$ controller 308 via signal POR-1 to clamp the voltage at terminal, $V_{GG}$, of $V_{GG}$ regulator 310 to a voltage magnitude that is equal to the voltage magnitude that is applied to terminal, $V_{DD}$. Once the voltage magnitude at terminal, $V_{GG}$, is clamped, the output of latch component 208, being pre-biased with a logic low level input data value, asserts terminal, Q, to a voltage magnitude that is substantially equal to the voltage magnitude at terminal, $V_{DD}$, by operation of transistor 216 of latch component 208. Similarly, the voltage magnitude present at terminal, Q-complement, is reset to a logic low value by operation of transistor 214 of latch component 206.

It is noted, that the time duration between time 404 and 406 is sufficient to allow control signals, AA, AB, and CONFIGURATION DATA, to stabilize to expected voltage magnitude levels. It is further noted, that the time duration between time 404 and 408 is sufficient to allow all memory cells 200 of the one or more memory cell arrays 304 to reset to a known logic state, e.g., a logic high level asserted at terminal, Q, and a logic low level deasserted at terminal, Q-complement, while the regulated power supply, $V_{GG}$, continues to initialize. That is to say in other words, that memory cell arrays 304 are capacitive and require an amount of time, e.g., the time duration between time 406 and 408, to allow each memory cell to charge to a known logic state using operational power that is provided at terminal, $V_{DD}$.

At time 408, POR state machine 306 instructs $V_{GG}$ controller 308 via signal POR-2 to release the clamp and allow $V_{GG}$ regulator 310 to begin regulation of the voltage magnitude that is present at terminal, $V_{GG}$. Once the regulated voltage applied at terminal, $V_{GG}$, is stabilized, POR state machine 306 instructs address drivers 312 via signal POR-3 to deassert the logic level applied to terminal, AA, to a logic low level at time 410. Some time later, each memory cell 200 of each memory cell array 304, having been properly biased to a known logic state, is then ready to receive configuration data at time 412, as indicated by signal POR-4, during the configuration process of FPGA 100 of FIG. 1 as dictated by configuration controller 314.

Figure 5:
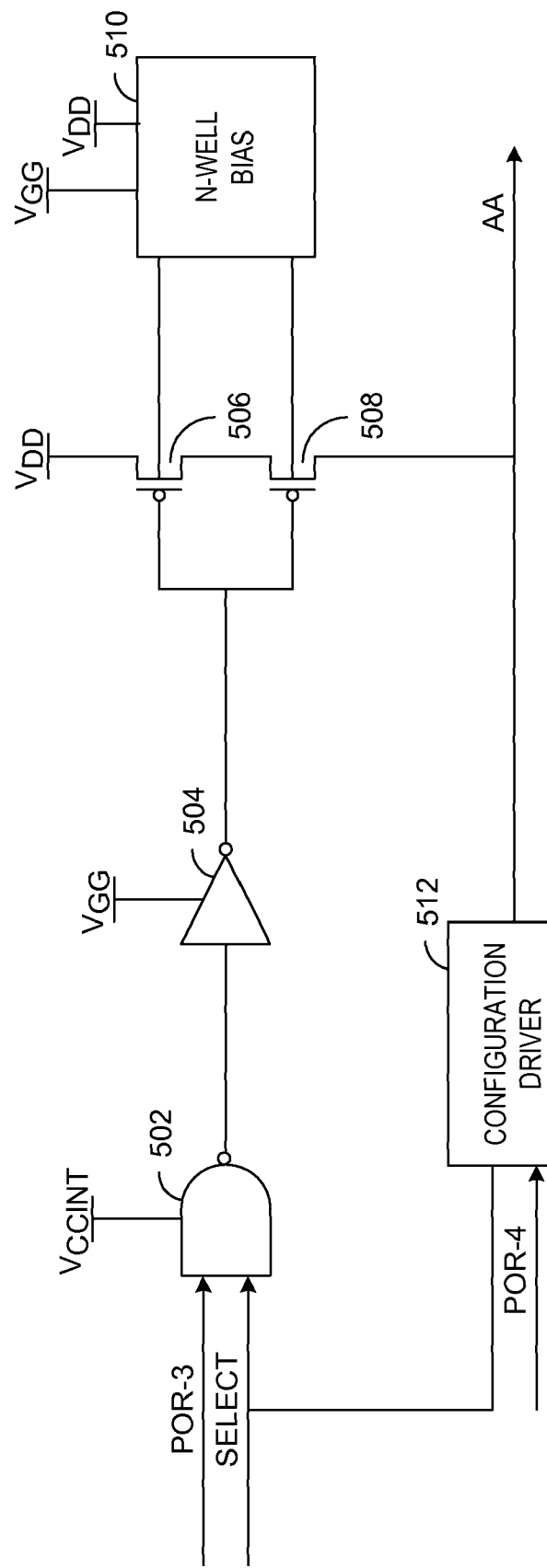
FIG. 5 illustrates a schematic diagram of an address driver of the memory cell array controller of FIG. 4 in accordance with an embodiment of the present invention.

Turning to FIG. 5, a schematic diagram of the AA address line driver within address drivers 312 is illustrated in accordance with one embodiment of the present invention. It is noted that the AB address line driver within address drivers 312 is similarly implemented, except that circuitry (not shown) disallows the AB address driver from asserting the voltage magnitude at address line, AB, during the POR sequence. NAND gate 502 receives signal SELECT at a first input terminal and signal POR-3 at a second input terminal. The output terminal of NAND gate 502 is connected to the input terminal of inverting level shifter 504. It is noted, for example, that NAND gate 502 derives operational power from an internal power supply signal, e.g., $V_{CCINT}$, which generally operates at a lower voltage magnitude than the voltage magnitude present at terminal $V_{GG}$ during normal operation. As such, inverter 504 level shifts the logic high data values provided by NAND gate 502 from a voltage magnitude that is substantially equal to the voltage magnitude present at terminal, $V_{CCINT}$, to a voltage magnitude that is substantially equal to the voltage magnitude present at terminal, $V_{GG}$.

The output of level shifter 504 is connected to an address line driver, e.g., cascode connected p-type MOS (PMOS) transistors 506 and 508. N-well bias generator 510 is connected to the N-well region of PMOS transistors 506 and 508. Configuration driver 512 receives signals SELECT and POR-4 as input signals, while the output of configuration driver 512 is connected to the drain terminal of transistor 508 at address line AA.

The operation of the AA address driver of FIG. 5 is explained in conjunction with the timing diagram of FIG. 4. Prior to time 410, signal POR-3 is deasserted to a logic low level, which sets the logic operation of NAND gate 502 to that of a gated inverter. As such, the logic level of signal SELECT has no effect on the logic level that is provided by NAND gate 502 prior to time 410, since signal POR-3 is deasserted. Prior to time 406, however, signal $V_{GG}$ is pulled to a logic low level, which deasserts the output of inverting level shifter 504 to a logic low level. In response, PMOS transistors 506 and 508 are rendered conductive, which applies the voltage magnitude that is present at terminal, $V_{DD}$, to address line AA via address line driver 506/508. At time 406, signal $V_{GG}$ is clamped to a logic high level, which then allows the output of inverting level shifter 504 to actively deassert after time 406 and before time 410.

At time 410, signal POR-3 is asserted by POR state machine 306 and signal SELECT is asserted by configuration controller 314 of FIG. 3, which renders PMOS transistors 506 and 508 non-conductive. At time 412, signal POR-4 is asserted by POR state machine 306 to allow configuration driver 512 to control the logic level at address line AA as required during configuration of FPGA 100. It can be seen, therefore, that the AA address driver of FIG. 5 operates in accordance with the timing diagram of FIG. 4 to maintain the logic level of address line AA at the correct potential to insure that each memory cell 200 of memory cell array(s) 304 is correctly biased during the power-up sequence. In particular, it is noted that even while signal $V_{GG}$ is pulled to a logic low level prior to time 406, the voltage magnitude present at address line AA is nevertheless equal to a logic high level, e.g., equal to the voltage magnitude present at terminal $V_{DD}$ by operation of address line driver 506/508, so as to facilitate correct biasing of latch component 206 during the POR sequence.

It is noted, that N-well bias generator 510 applies the correct potential to the N-well regions of PMOS transistors 506 and 508 to prevent leakage current flow between terminal, $V_{DD}$, and address line, AA, during the power-up sequence. That is to say, in other words, that if the voltage magnitude present at terminal, $V_{DD}$, is greater than the voltage magnitude present at terminal, $V_{GG}$, then the voltage magnitude present at terminal, $V_{DD}$, is applied to the N-well regions of transistors 506 and 508 by N-well bias generator 510 to prevent forward biasing of the body diode of transistors 506 and 508. If, on the other hand, the voltage magnitude present at terminal, $V_{GG}$, is greater than the voltage magnitude present at terminal, $V_{DD}$, then the voltage magnitude present at terminal, $V_{GG}$, is instead applied to the N-well regions of transistors 506 and 508 by N-well bias generator 510 to prevent forward biasing of the body diode of transistors 506 and 508.

Figure 6:
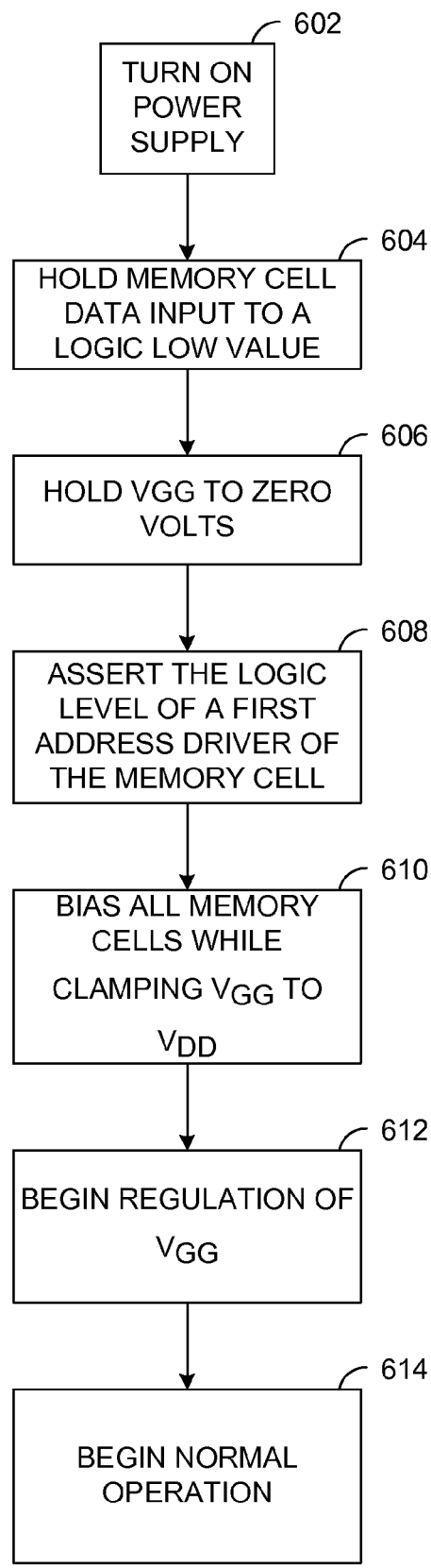
FIG. 6 illustrates a flow diagram of a power-up sequence executed by the memory cell array controller of FIG. 3 in accordance with an embodiment of the present invention.

Turning to FIG. 6, a flow diagram of a power-up sequence in accordance with one embodiment of the present invention is illustrated. At step 602, the power supply voltage magnitude that is applied to terminal, $V_{DD}$, is allowed to begin ramping to its operational magnitude. Since address line drivers 312 of FIG. 3 receive operational power from terminal, $V_{DD}$, the voltage magnitude that is present on address line, e.g., AA, simultaneously ramps to a logic high value as in step 608. As discussed above in relation to FIG. 4, the voltage magnitude that is present on address line, AB, is held to a logic low value during the POR sequence. Turning back to FIG. 2, it is seen that pass gate 202 within memory cell 200 of memory cell array(s) 304 is rendered conductive once the voltage magnitude at address line, AA, exceeds the threshold potential of pass gate 202.

The voltage magnitude of the configuration data signal, CONFIGURATION DATA, that is applied to terminal, D, of memory cell 200 is held to a logic low value in step 604. Since the voltage magnitude that is present on address line, AA, of the memory cell is asserted to a logic high value, e.g., a voltage magnitude that is substantially equal to a power supply signal magnitude, e.g., $V_{DD}$, a logic low value is allowed to pre-bias the input of latch component 208 of memory cell 200. Next, the voltage magnitude that is provided to the power terminal, e.g., $V_{GG}$, of the memory cell is held to be substantially equal to ground potential in step 606.

Signal POR is then asserted to a logic high level, which resets POR state machine 306. In response, the voltage magnitude applied to terminal, $V_{GG}$, by $V_{GG}$ regulator 310 either remains pulled down to a logic low value as illustrated, or is allowed to float to an indeterminate logic level.

At step 610, POR state machine 306 instructs $V_{GG}$ controller 308 to clamp the voltage at terminal, $V_{GG}$, of $V_{GG}$ regulator 310 to a voltage magnitude that is equal to the voltage magnitude that is applied to terminal, $V_{DD}$. Once the voltage magnitude at terminal, $V_{GG}$, is clamped, the output of latch component 208, being pre-biased with a logic low level input data value, asserts terminal, Q, to a voltage magnitude that is substantially equal to the voltage magnitude at terminal, $V_{DD}$, by operation of transistor 216 of latch component 208. Similarly, the voltage magnitude present at terminal, Q-complement, is reset to a logic low value by operation of transistor 214 of latch component 206.

At step 612, POR state machine 306 instructs $V_{GG}$ controller 308 to release the clamp and allow $V_{GG}$ regulator 310 to begin regulation of the voltage magnitude that is present at terminal, $V_{GG}$. Once the regulated voltage applied at terminal, $V_{GG}$, is stabilized, the logic level applied to terminal, AA, is deasserted to a logic low level. At step 614, each memory cell 200 of memory cell array(s) 304, having been properly biased to a known logic state, is then ready to receive configuration data during configuration of FPGA 100 of FIG. 1 as dictated by configuration controller 314 to begin normal operation.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of biasing the logic state of a memory cell during a power-up sequence, the method comprising:
    activating a first power supply to assert a first power supply signal;
    deasserting a data input signal to the memory cell;
    clamping a second power supply signal to be substantially equal to a zero volt magnitude;
    asserting an address signal to the memory cell in response to the asserted first power supply signal while the second power supply signal is substantially equal to a zero volt magnitude;
    initializing the second power supply, the second power supply being adapted to provide operational power to the memory cell; and
    maintaining the data input signal at the deasserted logic state during the initialization of the second power supply to bias the logic state of the memory cell during the power-up sequence.

2. The method of claim 1, wherein asserting the address signal to the memory cell comprises providing the first power supply signal to an address driver, wherein the address driver derives operational power from the first power supply signal.

3. The method of claim 2, wherein asserting the address signal to the memory cell further comprises providing the second power supply signal to a level shifter, wherein the level shifter derives operational power from the second power supply signal to provide a logic signal at an output of the level shifter while the second power supply signal is substantially equal to a zero volt magnitude.

4. The method of claim 3, wherein asserting the address signal to the memory cell further comprises activating the address driver with the logic signal to apply the first power supply signal as the address signal.

5. The method of claim 1, wherein initializing the second power supply comprises clamping the second power supply signal to be equal to a voltage magnitude of the first power supply signal during a first portion of the power-up sequence.

6. The method of claim 5, wherein initializing the second power supply further comprises regulating the second power supply signal during a second portion of the power-up sequence.

7. A method of performing a power-on reset sequence within an integrated circuit, the method comprising:
    activating a first power supply to assert a first power supply signal within the integrated circuit;
    deasserting data input signals to a plurality of memory cells contained within the integrated circuit;
    clamping a second power supply signal within the integrated circuit to be substantially equal to a zero volt magnitude;
    asserting address signals to the plurality of memory cells in response to the asserted first power supply signal while the second power supply signal is substantially equal to a zero volt magnitude;
    initializing the second power supply, the second power supply being adapted to provide operational power to the plurality of memory cells; and
    maintaining the data input signals at the deasserted logic states during the initialization of the second power supply to bias the logic states of the plurality of memory cells to predetermined logic levels.

8. The method of claim 7, wherein asserting the address signals to the plurality of memory cells comprises providing the first power supply signal to a plurality of address drivers, wherein each address driver derives operational power from the first power supply signal.

9. The method of claim 8, wherein asserting the address signals to the plurality of memory cells further comprises providing the second power supply signal to a level shifter within each address driver, wherein the level shifter derives operational power from the second power supply signal to provide a logic signal at an output of the level shifter while the second power supply signal is substantially equal to a zero volt magnitude.

10. The method of claim 9, wherein asserting the address signals to the plurality of memory cells comprises activating each address driver with the logic signal to apply the first power supply signal as the address signal.

11. The method of claim 7, wherein initializing the second power supply comprises clamping the second power supply signal to be equal to a voltage magnitude of the first power supply signal during a first portion of the power-on reset sequence.

12. The method of claim 11, wherein initializing the second power supply further comprises regulating the second power supply signal during a second portion of the power-on reset sequence.

* * * * *